United States Patent [19]
Whatmore et al.

[11] Patent Number: 4,876,776
[45] Date of Patent: Oct. 31, 1989

[54] METHOD OF MAKING PIEZOELECTRIC COMPOSITES

[75] Inventors: Roger W. Whatmore, Bletchley; Andrew G. Munns, Northampton; David W. Lane, Wiltshire, all of England

[73] Assignee: Plessey Overseas Limited, Ilford, England

[21] Appl. No.: 109,358

[22] Filed: Feb. 11, 1988

Related U.S. Application Data

[63] Continuation of Ser. No. 804,565, Dec. 4, 1985, abandoned.

[30] Foreign Application Priority Data

Dec. 15, 1984 [GB] United Kingdom ............ 8431718

[51] Int. Cl.$^4$ ............................................. H01L 41/22
[52] U.S. Cl. .............................. 29/25.35; 264/272.15
[58] Field of Search ............... 29/25.35; 264/272.15; 310/357–359, 800, 340, 348

[56] References Cited

U.S. PATENT DOCUMENTS

| | | | |
|---|---|---|---|
| 3,070,775 | 12/1962 | Andrews, Jr. | 310/357 X |
| 3,772,419 | 11/1973 | Schoening. | |
| 4,412,148 | 10/1983 | Klicker et al. | 310/358 |
| 4,564,980 | 1/1986 | Diepers. | |

FOREIGN PATENT DOCUMENTS 0041664 12/1981 European Pat. Off. .

Primary Examiner—Carl E. Hall
Attorney, Agent, or Firm—Fleit, Jacobson, Cohn, Price, Holman & Stern

[57] ABSTRACT

A method of fabricating a piezoelectric composite comprising an array of piezoelectric elements and a reinforcement structure embedded in a material. The method includes the step of forming the reinforcement structure prior to assembly with the piezoelectric elements, the reinforcement structure defining an array of holes for receiving the piezoelectric elements.

3 Claims, 2 Drawing Sheets

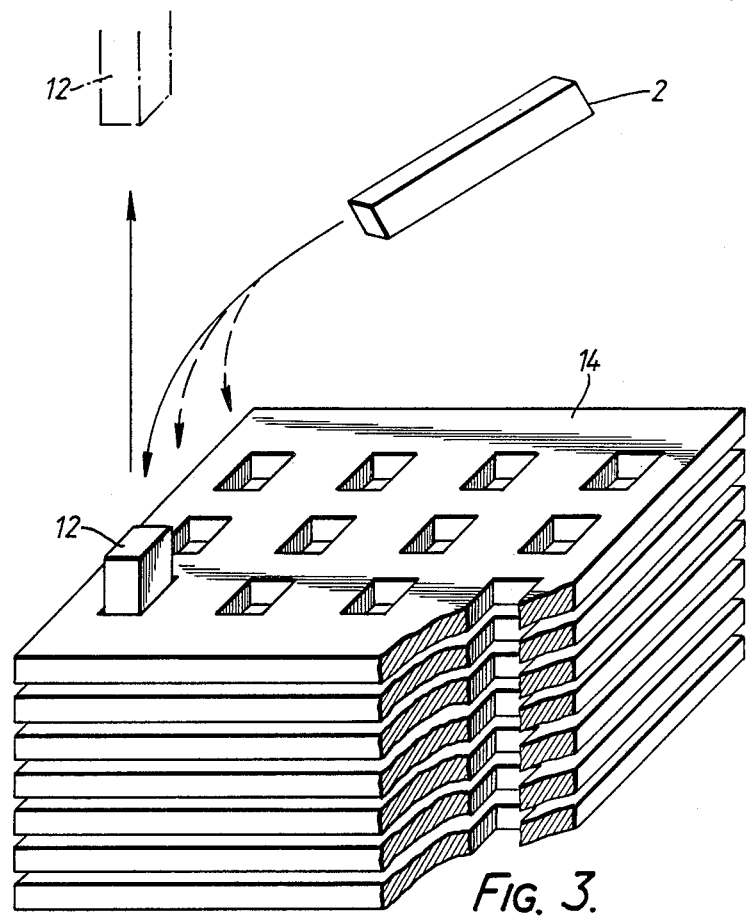
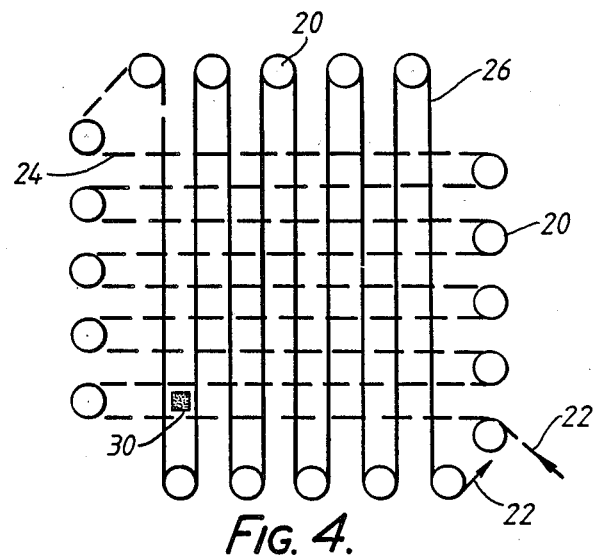

METHOD OF MAKING PIEZOELECTRIC COMPOSITES

The present invention relates to piezoelectric composite and more particularly to reinforced piezoelectric composites, and is a Continuation Application of U.S. patent application No. 804,565 (abandoned).

Reinforced piezoelectric composites are known, the structure of which comprises an array of parallel, spaced rods of a piezoelectrc ceramic embedded in a matrix material, the piezoelectric rods being aligned so as to be all polarized in the same direction. Reinforcement members in the form of glass rods are also embedded in the matrix material, the glass rods being arranged in two mutually perpendicular arrays each of which intermeshes with and is perpendicular to the array of parallel piezoelectric ceramic rods. Such a structure is known as a three phase composite with a 3-1-1 connectivity by which is meant that the matrix material is a three dimensionally connected phase, the piezoelectric ceramic rods each represent a one dimensionally connected phase and the reinforced rods each represent a one dimensionally connected phase.

It is known to assemble the above structure by first assembling the parallel array of ceramic rods and then assembling into position one by one the reinforcing glass rods. This is an extremely time consuming process as some of the glass rods may have diameters as low as 0.25 mm and there may be many hundreds of such rods that require assembly.

One of the objects of the present invention is to reduce the fabrication time of a three phase composite.

SUMMARY OF THE INVENTION

According to the present invention there is provided a method of fabricating a piezoelectric composite comprising an array of piezoelectric elements and a reinforcement structure together embedded in a material, the method including the step of forming the reinforcement structure prior to assembly with the piezoelectric elements, the reinforcement structure defining an array of holes for receiving the piezoelectric elements.

In one embodiment of the present invention the reinforcement structue has a mesh-lke configuration, and is preferably in the form of a woven mesh. A number of the mesh-like reinforcement structures are piles on top of one another to define layers of mesh having their holes in alignment to form a reinforcement cage-like structure defining an array of holes for receiving the piezoelectric elements.

In another embodiment of the present invention each reinforcement structure is in the form of a sheet of material, with or without pre-ipregnation of a polymeric material, the sheet of material being punched to give a two dimensional array of holes for receiving the piezoelectric elements. In one form of the embodiment a number of sheets of the material are piles on top of one another to form a reinforcement cage-like structure defining the array of holes for receiving the piezoelectric elements. In another embodiment of the present invention the reinforcement structure is formed by piling together a plurality of sheets of reinforcement material, an array of holes being formed through the pile of sheets when assembled to define a reinforcement stucture having the array of holes for receiving the piezoelectric elements.

In all of the above embodiments after the reiforcement structure or structures have been assembled, and the piezoelectric elements placed in the holes, the entire construction is cast in a suitable matrix material and is trimmed to shape. The final construction formed in a three phase composite having a 3-1-2 connectivity by which is meant that the matrix material is a three dimensionally connected phase, the piezoelectric elements each represent a one dimensionally connected phase and each reinforcement is a tow dimensionally connected phase.

It is however within the scope of the invention to create a three phase composite having a 3-1-1 connectivity by using a one dimensionally connected reinforcement phase. This may be achieved for example by forming the reinforcement structure from a reinforcing member in the form of a strand of reinforcing fibrous material which is woven into a multi-layered cage-like structure prior to assembly with the piezoelectric elements.

In a further embodiment of the present invention the fabrication process includes the step of first producing an array of parallel, aligned piezoelectric elements having spacings corresponding to the pitch between the holes in the reinforcement structures, the reinforcement structures being placed over the array of piezoeletric elements.

An aspect of the present invention is the provision of a piezoelectric composite fabricated by any one of the methods according to the present invention described above.

In one embodiment of the present invention there is provided a piezoelectric composite comprising an array of piezoelectric elements and a reinforcement structure embedded in a common material, at least some parts of the reinforcement structure extending in two directions substantially perpendicular to the direction of alignment of the piezoelectric elements to form a piezoelectric composite having a 3-1-2 connectivity.

In one preferred embodiment of the present invention each reinforcement structure defines an array of reinforcement elements which intermeshes with and is aligned substantailly perpendicular to the array of piezoelectric elements.

BRIEF DESCRIPTION OF THE DRAWINGS

The present invention will be described further, by way of examples, with reference to the accompanying drawings in which:

FIG. 3 illustrates a reinforcement cage construction used in the fabrication of a piezoelectric composite stucture according to another embodiment of the present invention; and, FIG. 4 illustrates a reinforcement cage construction used in the fabrication of a piezoelectric composite structure according to a further embodiment of the present invention.

Figure 1:
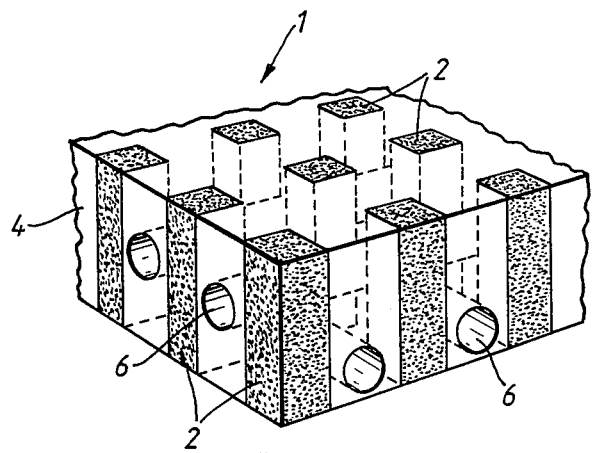
FIG. 1 is an illustration of a known reinforced piezoelectric composite structure.

An internal view of a corner section 1 of a block of known reinforcement piezoelectric composite is shown in FIG. 1. The structure of the composite consists of an array of parallel, spaced rods 2 of a piezoelectric ceramic embedded in a matrix material 4, the piezoelectric rods 2 being aligned so as to be all polarized in the same direction. The matrix material 4 consists of an epoxy resin and the reinforcement members are in the form of glass rods 6 arranged in two mutually perpendicular arrays each of which intermeshes with and is perpendicular to the array of parallel piezoelectric rods 2.

The fabrication of the reinforced piezoelectric composite shown in FIG. 1 involves first assembling into position the parallel array of spaced piezoelectric rods 2, next assembling each of the glass rods 6 into its respective position within the array of piezoelectric rods 2 and finally casting the assembled piezoelectric rod 2 and glass rods 6 in the matrix material 4. The fabrication can be extremely time consuming as it involves each of the glass rods being individually placed into its respective position.

DESCRIPTION OF PREFERRED EMBODIMENTS

In order to reduce the fabrication time the reinforcement members and the piezoelectric rods 2 can be assembled together by a number of methods according to various embodiments of the present invention. One group of methods makes use of preassembled cages constructed of reinforcement members as will now be described with reference to FIGS. 2, 3 and 4.

Figure 2:
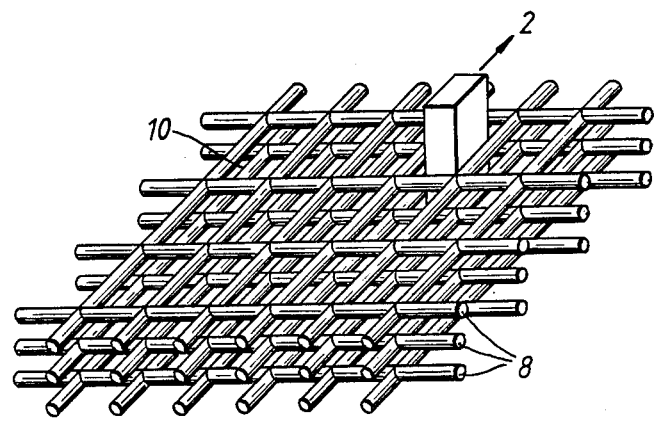
FIG. 2 illustrates a reinforcement cage construction used in the fabrication of a piezoelectric composite structure according to one embodiment of the present invention.

Referring to FIG. 2 a pre-woven glass fibre mesh, or other suitable mesh-like material, is cut into equal sized pieces to form reinforcement structures which are carefully piled on top of each other to form layers of mesh 8 having their holes in alignment. In this way a reinforcement cage is assembled having an array of parallel holes (10) for accepting the piezoelectric rods 2.

Referring to FIG. 3 reinforcement structures of sheets of glass fibre mat 14, or mat made from any other reinforcement fibres with or without preimpregnation of other polymeric materials such as polymeric resins, are punched to give a two dimensional array of holes. The sheets of mat 14 are cut into equally sized pieces and piled up to form the cage shown in FIG. 3 for accepting the piezoelectric rods 2.

During the method of cage assembly with reference to FIGS. 2 and 3 a metal or ceramic support peg 12 may be inserted in at least two corner holes to assist in securing the cage during assembly.

A cage of glass thread, or other reinforcing fibrous material, can be woven using a support peg arrangement such as that shown in FIG. 4. The peg arrangement of FIG. 4 consists of two parallel rows and two parallel columns of pegs 20 there being five pegs 20 in each row and in each column. A thread or yarn 22 is wound around and between the two columns of pegs 20 to form a first layer 24 of thread or yarn. The thread or yarn 22 is then wound around and between the pegs 20 defining the two rows so as to form a second layer 25 of thread or yarn. Thereafter the thread or yarn 22 is again woven between the two columns of pegs to create a third layer and so on. In this way a reinforcement structure in the form of a woven cage is formed having an array of parallel holes 30 for accepting the piezoelectric rods.

In another embodiment of cage construction layers of unpunched glass fibre, or other fibrous reinforcement material, mat preimpregnated with suitable matrix material are cut into equal sized pieces and piled on top of each other. The pile is trimmed to the required shape and a two dimensional array of parallel holes are drilled in the pile. In this way a reinforcement cage structure precoated in the matrix material is produced.

When the reinforcement cages described above have been assembled, and the piezoelectric rods placed in the holes with all of the piezoelectric rods polarized in the same direction, the entire structure is cast in the matrix material and trimmed to shape. Good adhesion between the matrix material and the reinforcement members can be ensured by pretreating the reinforcement members with an adhesion promoter. One such adhesion product is Dow Corning's adhesion promotor Z6040. Other techniques for ensuring good adhesion include a surface etch of the reinforcement members, for example chromic acid etching of glass reinforcement rods, by precoating the glass reinforcement rods with a suitable secondary matrix material so as to form an intermediate layer situated between the reinforcement members and the main matrix material.

Another method of fabricating a reinforced piezoelectric composite according to an embodiment of the present invention involves a comb type method of construction. The method of construction includes first producing a two dimensional array of parallel aligned piezoeledtric rods. This can be achieved by either placing pre-cut rods in a suitable array of holes in a metal base plate, having previously placed a soft material such as plasticine or wax in the holes to hold them firmly, or by forcing them into a bed of soft wax so that they stand up in a regular array or by saw cutting a two dimensional comb or array from a solid block of piezoelectric material.

Precut equal sized pieces of mesh or punched mat, of the same pitch as the rod spacing, can then be placed over the comb to build up the reinforcement cage, or an assembled cage, made as described above by drilling holes in a pile of unpunched layers of matrix material, can be placed over the rods. The assemlby is then cast in a suitable composite matrix material and trimmed to shape.

The piezoelectic composites are used primarily as piezoelectric transducers and in some applications of piezoelectric transducers, such as hydrophones, entrapped bubbles are undesirable. To prevent them forming, it is advisable to ensure that the matrix material is vacuum out-gassed to remove dissolved air and water vapour, and that the matrix material is poured onto the assembled structure under vacuum to present the trapping of larger quantities of air. for example, oug-gassing of Eccogel (a Registered Trade Mark) 1365-80 epoxy resin (manufactured by Emerson and Cuming) was found to take approximately one hour at a vacuum of 740 mm Hg. This may vary, however, with the type, age and temperature of the epoxy resin used.

When discussing the properties of piezoelectric materials, it is convenient to define an axial system to which they can be referred. For the purpose of this specification properties will be referred to a right-handed axial set in which the axis, and properties referred to them, are distinguished by the three subscripts '1', '2' and '3'. The axis $x_3$ is defined as being parallel to the polar direction in the material, (or the direction of poling in a piezoelectric ceramic). The $x_1$ and $x_2$ axes are defined as being mutually perpendicular to each other and to the $x_3$ axis. In the case of 3-1-1 piezoelectric composites containing glass rod reinforcement, the $x_1$ and $x_2$ axes are defined so that they are mutually perpendicular to each other and to the $x_3$ axis and parallel to the directions in which the glass rods are laid.

In a piezoelectric material, the charges generated across the poled faces are dependent upon the piezoelectric charge coefficients $d_{ij}$, here, use is made of the reduced subscript notation for the piezoelectric coefficients as defined by J. F. Nye in his publication "Physical Properties of Crystals", (Clarendon Press, Oxford) Chapter VII. In a hydrostatic system the stress, $\sigma$, in each of the three mutually perpendicular directions is the same and hence:

$$Q/A = \sigma(d_{31} + d_{32} + d_{33}) = \sigma d_H$$

Where $d_H$ is they hydrostatic charge coefficient ($d_H = d_{31} + d_{32} + d_{33}$), Q is the charge generated on the poled faces and A is the area of the poled faces.

In a homogeneous cube of the piezoelectric material generically known as PZT (in the PZT family, the major constituent is a ceramic solid solution $(PbZrO_3)_x \cdot (PbTiO_3)_{1-x}$ where x 0.52) $d_{31} = d_{32} \approx -d_{33}/2$ and hence $d_H$ is close to zero, giving a small charge output when under hydrostatic stress. A two phase composite structure with 3-1 connectivity that consists of a two dimensional array of parallel aligned piezoelectric rods embedded in a continuous matrix, with no third phase reinforcement, has been shown to have an increased value of $d_H$ relative to the PZT materials, (see Table 1) below. This is due to the matrix introducing stress relief in the two directions mutually perpendicular to the rod direction, (the $x_1$ and $x_2$ axes) resulting in smaller longitudinal stresses $\sigma_1$ and $\sigma_2$ being experienced by the piezoelectric rods. The hydrostatic charge coefficient of the composite as a whole is thus bigger than that of the piezoelectric material alone, hence giving an increased charge output for any particular pressure change. The lower volume fraction of piezoelectric material also produces a drop in the average dielectric constant $\epsilon$ of the composite which, with the increase in the $d_H$ gives an increase in the piezoelectric voltage coefficient $g_H$ (where $g_H = d_H/\epsilon$) relative to the piezoelectric material. This produces a greatly increased value for the piezoelectric figure of merit, $d_H \cdot g_H$, which represents the energy output of the device per unit volume, per unit pressure change squared. Examples of suitable ceramic materials are PZT-5H and PZT-4. Examples of suitable polymeric materials are Eccogel 1365-80, Stycast 1264 (Trade Marks) (both epoxy resins manufactured by Emerson and Cuming), Araldite MY763 (a Trade Mark) (manufactured by Ciba-Giegy Ltd).

The addition of a third reinforcement phase to the composite matrix introduces reinforcement phase to the composite matrix introduces improved stress relief and hence increases $d_H$, $g_H$ and $d_H g_H$ further. Table 2(a) shows the characteristics of two examples of three phase composites made with 0.6 mm square PZT-5H ceramic rods embedded in Eccogel 1365-80 epoxy resin with 0.25 mm diameter borosilicate glass rod reinforcement and Table 2(b) shows the characteristics of two examples of three phase composites of similar construction to those in Table 2(a), except cast in a harder epoxy potting compound than Eccogel.

Table 3 gives the values of $d_H$, $g_H$ and $d_H g_H$ for a three phase composite made with 0.6 mm square PZT-5H ceramic rods and a ceramic volume fraction of 0.063. This sample had a matrix of Eccogel 1365-80 epoxy resin and was reinforced with silica glass thread. The sample was approximately 24 mm square and 14 mm thick with a capacitance of 46 pF. The results show that all three samples were capable of high output when compared to an ordinary ceramic block (see Table 1), and are comparable in performance with the three phase composites of Table 2.

Table 4 gives the values of $d_H$, $g_H$ and $d_H g_H$ for two three phase composites produced using a prewoven glass fibre mesh such as Automesh (Trade Mark) and Eccogel 1365-80 epoxy resin in accordance with one embodiment of our invention. Both samples had 1mm square PZT-5H ceramic rods with a ceramic volume fraction of approximately 0.08 and the results show that the construction process exhibits good reproducibility. Both samples were approximately 35 mm square and 15 mm thick with a capacitance of approximately 80 pF.

TABLE 1

Solid piezoelectric ceramic compared to a two phase piezoelectric composite.

| Characteristic | PZT-5H Solid Ceramic Block | Two Phase Composite (PZT-5H 24% by volume Araldite MY763 76% by volume) | Units |
|---|---|---|---|
| $d_H$ = | 45 | 84.6 | $pCN^{-1}$ |
| $g_H$ = | 1.48 | 19.0 | $10^{-3} VmN^{-1}$ |
| $d_H g_H$ = | 67 | 1610 | $10^{-15} Pa^{-1}$ |

TABLE 2

Characteristics of 3 phase composites
(a) Eccogel 1365-80 epoxy resin matrix
(b) Harder epoxy potting compound matrix than Eccogel (a)

| Ceramic Volume Fraction | Glass Volume Fraction | $d_H$ $pCN^{-1}$ | $g_H$ $10^{-3}$ $VmN^{-1}$ | $d_H g_H$ $10^{-15}$ $Pa^{-1}$ |
|---|---|---|---|---|
| 0.15 | 0.11 | 148 | 46.3 | 6850 |
| 0.20 | 0.13 | 199 | 54.1 | 10760 |

(b)

| Ceramic Volume Fraction | Glass Volume Fraction | $d_H$ $pCN^{-1}$ | $g_H$ $10^{-3}$ $VmN^{-1}$ | $d_H g_H$ $10^{-15}$ $Pa^{-1}$ |
|---|---|---|---|---|
| 0.25 | 0.15 | 122 | 22.3 | 2710 |
| 0.30 | 0.16 | 125 | 16.1 | 2030 |

TABLE 3

Results obtained for a 3 phase composite made with glass thread reinforcement.

| | | |
|---|---|---|
| $d_H$ | = | 50.5 $pCN^{-1}$ |
| $g_H$ | = | 45.5 ($\times 10^{-3}$) $Vmn^{-1}$ |
| $d_H g_H$ | = | 2300 ($\times 10^{-15}$) $Pa^{-1}$ |

TABLE 4

Results obtained for two three phase composites made with "Automesh" glass-fibre mesh reinforcement

| Characteristic | Sample 1 | Sample 2 | Units |
|---|---|---|---|
| $d_H$ = | 71.8 | 71.2 | $pCN^{-1}$ |
| $g_H$ = | 76.0 | 70.0 | $10^{-3} VmN^{-1}$ |
| $d_H g_H$ = | 5640 | 4990 | $10^{-15} Pa^{-1}$ |

The reinforcement members in alternative embodiments include glass rods, glass fibres, glass threads, Kevlar (Trade Mark) fibres or other stiff fibrous material or combinations thereof, including for example chopped strand glass fibre mat.

It will also be appreciated that the types of piezoelectric ceramic materials described above, are given by way of example only as it is possible to use other types of piezoelectric material for the purposes of the present invention, such as barium titanate ceramic and antimony sulphor iodide.

We claim:

1. A method of fabricating a piezoelectric composite comprising an array of piezoelectric elements and a reinforcement structure embedded in a matrix material, wherein the improvement lies in that the method comprises forming the reinforcement structure, prior to assembly with the piezoelectric elements, as a reinforcement cage by weaving a strand of reinforcing fibrous material into a multi-layered cage-like structure defining an array of holes therethrough for receiving and supporting the piezoelectric elements during the fabrication of the piezoelectric composite, inserting the piezoelectric elements into the array of holes through the reinforcement cage and casting the matrix material around the resulting structure to form the piezoelectric composite.

2. A method of fabricating a piezoelectric composite as claimed in claim 1 wherein the reinforcement cage has a mesh-like configuration.

3. A method of fabricating a piezoelectric composite as claimed in claim 1 wherein the reinforcement cage is in the form of a woven mesh.

* * * * *